(12) United States Patent
Wang et al.

(10) Patent No.: US 10,109,436 B2
(45) Date of Patent: Oct. 23, 2018

(54) KEYBOARD MODULE AND ELECTRONIC DEVICE USING THE SAME

(71) Applicant: Acer Incorporated, New Taipei (TW)

(72) Inventors: Jian-Siang Wang, New Taipei (TW); Ching-Piao Kuan, New Taipei (TW); Hung-Chi Chen, New Taipei (TW); Yi-Hsuan Yang, New Taipei (TW); Cheng-Yu Cheng, New Taipei (TW)

(73) Assignee: Acer Incorporated, New Taipei (TW)

( * ) Notice: Subject to any disclaimer, the term of this patent is extended or adjusted under 35 U.S.C. 154(b) by 36 days.

(21) Appl. No.: 15/482,057

(22) Filed: Apr. 7, 2017

(65) Prior Publication Data

US 2018/0218858 A1    Aug. 2, 2018

(30) Foreign Application Priority Data

Feb. 2, 2017    (TW) .............................. 106103484 A

(51) Int. Cl.
*H01H 13/82*    (2006.01)
*H01H 13/705*    (2006.01)
(Continued)

(52) U.S. Cl.
CPC ......... *H01H 13/705* (2013.01); *G06F 1/1616* (2013.01); *H01H 13/7065* (2013.01);
(Continued)

(58) Field of Classification Search
CPC ............. H01H 13/7065; H01H 13/705; H01H 13/702; H01H 13/82; H01H 2211/002; H01H 2221/038; H01H 2215/028; H01H 2215/048; H01H 2227/02; H01H 2213/00; H01H 2213/002; H01H 2213/004;
(Continued)

(56) References Cited

U.S. PATENT DOCUMENTS 5,742,242 A     4/1998  Sellers
6,144,003 A *  11/2000  Kamishima .......... H01H 13/702
                                                      200/5 A (Continued)

FOREIGN PATENT DOCUMENTS

CN      204288129       4/2015
TW      I543025         7/2016

*Primary Examiner* — Felix O Figueroa
(74) *Attorney, Agent, or Firm* — J.C. Patents

(57) ABSTRACT

A keyboard module and an electronic device using the keyboard module are provided. The keyboard module includes a housing, a plurality of keys, a micro pump chamber and an actuator. The housing has multiple openings with the keys disposed in the housing. Each key includes a switch membrane, a key cover, an elastic element and a scissor unit. The switch membrane has a key switch, the key cover is above the switch membrane, and the elastic element disposed between the switch membrane and the key cover triggers the key switch when being pressed and deformed. The scissor unit is disposed between the key cover and the switch membrane to support the key cover. The micro pump chamber disposed below the key cover includes a first chamber, a second chamber communicating with the first chamber, a check valve disposed between the first chamber and the second chamber, and an actuator driving the keys to be withdrawn into or protrude out of the openings.

14 Claims, 7 Drawing Sheets

(51) Int. Cl.
*G06F 1/16* (2006.01)
*H02N 2/02* (2006.01)
*H01H 13/7065* (2006.01)

(52) U.S. Cl.
CPC .............. *H01H 13/82* (2013.01); *H02N 2/02* (2013.01); *H01H 2211/002* (2013.01); *H01H 2213/002* (2013.01); *H01H 2213/008* (2013.01); *H01H 2213/014* (2013.01); *H01H 2215/028* (2013.01); *H01H 2221/038* (2013.01); *H01H 2227/02* (2013.01)

(58) Field of Classification Search
CPC ....... H01H 2213/006; H01H 2213/008; H01H 2213/01; H01H 2213/012; H01H 2213/014; H01H 2213/016
See application file for complete search history.

(56) References Cited

U.S. PATENT DOCUMENTS

| | | | |
|---|---|---|---|
| 6,946,611 B2* | 9/2005 | Yoneyama | H01H 13/82 200/515 |
| 8,154,527 B2* | 4/2012 | Ciesla | G06F 3/04886 178/18.01 |
| 8,928,621 B2* | 1/2015 | Ciesla | G06F 3/0202 345/174 |
| 9,246,487 B2* | 1/2016 | Casparian | G06F 3/0202 |
| 9,367,104 B2* | 6/2016 | Liu | G06F 1/203 |
| 2012/0223914 A1 | 9/2012 | Ciesla et al. | |
| 2018/0122595 A1* | 5/2018 | Han | H01H 13/7065 |
| 2018/0122599 A1* | 5/2018 | Han | H01H 13/84 |

* cited by examiner

KEYBOARD MODULE AND ELECTRONIC DEVICE USING THE SAME

CROSS-REFERENCE TO RELATED APPLICATION

This application claims the priority benefit of Taiwan application serial no. 106103484, filed on Feb. 2, 2017. The entirety of the above-mentioned patent application is hereby incorporated by reference herein and made a part of this specification.

BACKGROUND OF THE INVENTION

1. Field of the Invention

The invention relates to a keyboard module and an electronic device, and particularly relates to a keyboard module allowing keys to be withdrawn into the keyboard module and an electronic device using the keyboard module.

2. Description of Related Art

An elastic element, such as a rubber dome, is commonly disposed in a conventional key to serve as a source of elastic force restoring a key cap after the key is pressed.

However, since the conventional elastic element has a predetermined height, the key cap is restored to a fixed height after the key is pressed. Nevertheless, the laptop computers nowadays exhibit various forms of transformation. Particularly, there are already laptop computers whose displays are able to flip over 180 degrees with respect to the keyboard modules or tablet computers capable of being assembled with peripheral devices, such as a keyboard module. In practical use, when a keyboard surface of the keyboard module is flipped to face away from the display (or the tablet computer), the protruding keys may directly contact a surface of placement. Thus, the keys may be triggered when being pressed by the weight of the device.

SUMMARY OF THE INVENTION

The invention provides a keyboard module whose keys may protrude or be withdrawn based on needs.

The invention provides an electronic device using the aforementioned keyboard module.

A keyboard module according to an embodiment of the invention includes a housing, a plurality of keys, a micro pump chamber, and an actuator. The housing has a plurality of openings, and the keys are disposed in the housing. In addition, the keys are adapted to protrude out of the openings. Each of the keys includes a switch membrane, a key cover, an elastic element and a scissor unit. The switch membrane has a key switch. The key cover is disposed above the switch membrane. The elastic element is disposed between the switch membrane and the key cover, and the elastic element is adapted to be pressed and deformed by the key cover to trigger the key switch. The scissor unit is disposed between the key cover and the switch membrane to support the key cover. The micro pump chamber disposed in the housing and below the key cover includes a first chamber, a second chamber, and a check valve. The second chamber is disposed below the first chamber. In addition, the second chamber is adapted to communicate with the first chamber. The check valve is disposed between the first chamber and the second chamber, so that gas in the first chamber and the second chamber flows unidirectionally from one of the first chamber and the second chamber to the other of the first chamber and the second chamber. The actuator is connected to the micro pump chamber and adapted to change a gas volume in the micro pump chamber to drive the key to be withdrawn into or protrude out of the opening.

According to an embodiment of the invention, the elastic element is a rubber dome.

According to an embodiment of the invention, the actuator is a piezoelectric element.

According to an embodiment of the invention, the piezoelectric element is disposed on a bottom wall of the second chamber.

According to an embodiment of the invention, the second chamber is divided into an upper part and a lower part by a membrane, and the piezoelectric element is adhered to the membrane.

According to an embodiment of the invention, the actuator is a discharge pump or an intake pump.

According to an embodiment of the invention, the elastic element includes the first chamber.

According to an embodiment of the invention, the keyboard module further includes a flow channel. The flow channel is disposed between the first chamber and the second chamber. In addition, the flow channel communicates with the first chamber, and the second chamber is isolated from the flow channel by the check valve.

According to an embodiment of the invention, each of the first chambers is correspondingly in communication with to an inlet and an outlet of the flow channel.

According to an embodiment of the invention, the keyboard module further includes a plurality of ventilation tubes. The ventilation tubes are disposed between the first chamber and the second chamber.

An embodiment of the invention provides an electronic device. The electronic device includes a display and the aforementioned keyboard module. In addition, the keyboard module is pivoted to the display, and the display is adapted to flip with respect to the keyboard module.

According to an embodiment of the invention, when the keys of the keyboard module face away from the display, the keys are withdrawn in the openings.

According to an embodiment of the invention, the electronic device further includes a locking element disposed between the first chamber and the second chamber and electrically connected with a central control unit of the electronic device. The locking element is controlled by the central control unit to keep the key withdrawn in the opening.

According to an embodiment, the locking element is a separation plate adapted to prevent the first chamber and the second chamber from communicating with each other.

Based on the above, the keyboard module according to the embodiments of the invention allows the keys to be withdrawn into the openings of the housing through the communication between the micro pump chambers and the keys and the operation of the actuators. Thus, the electronic device using the keyboard module may be placed on a surface when the keys are withdrawn in the openings of the housing, so as to prevent the keys from being pressed and triggering relevant functions when the keyboard surface of the keyboard module is placed on the surface.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
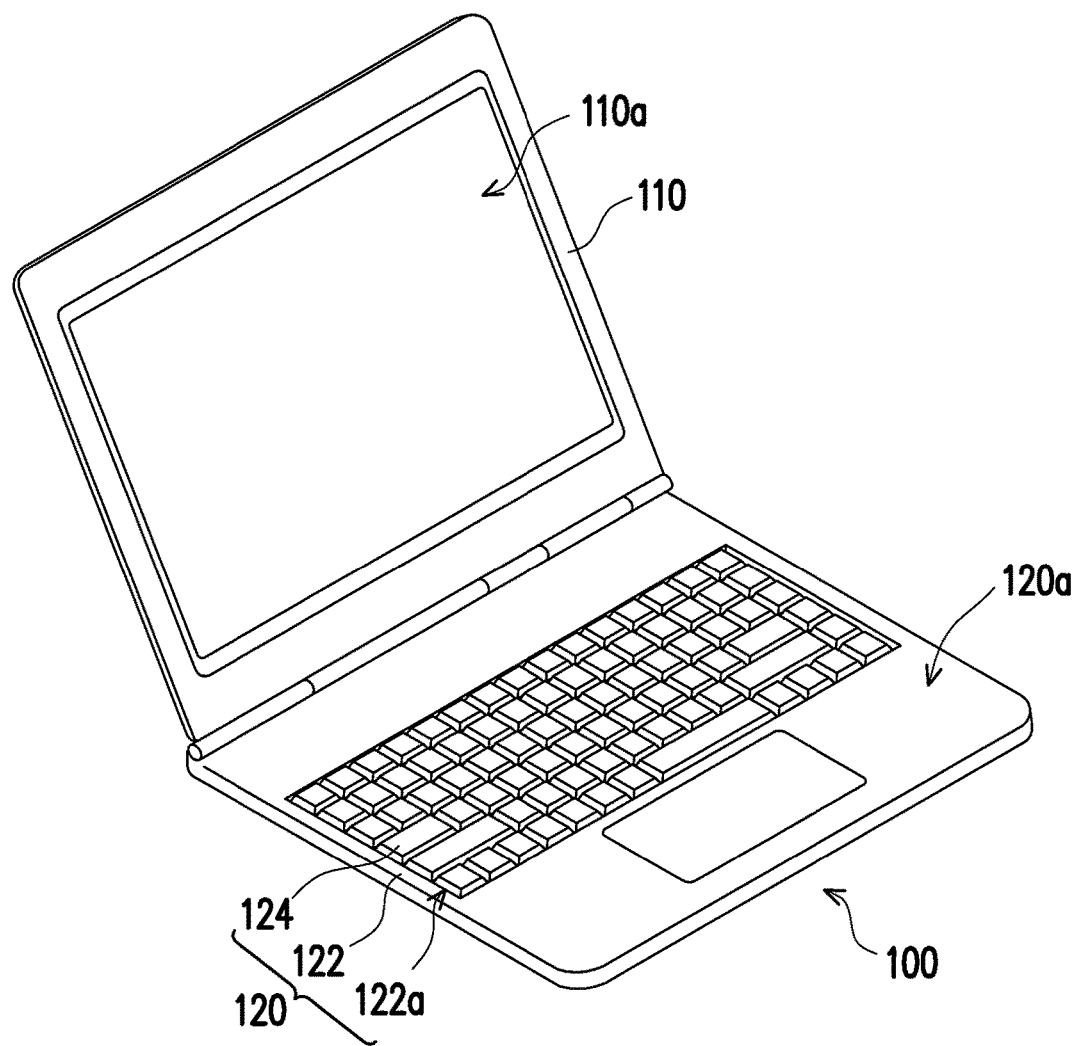
FIG. 1 is a schematic view illustrating an electronic device.

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 2A:
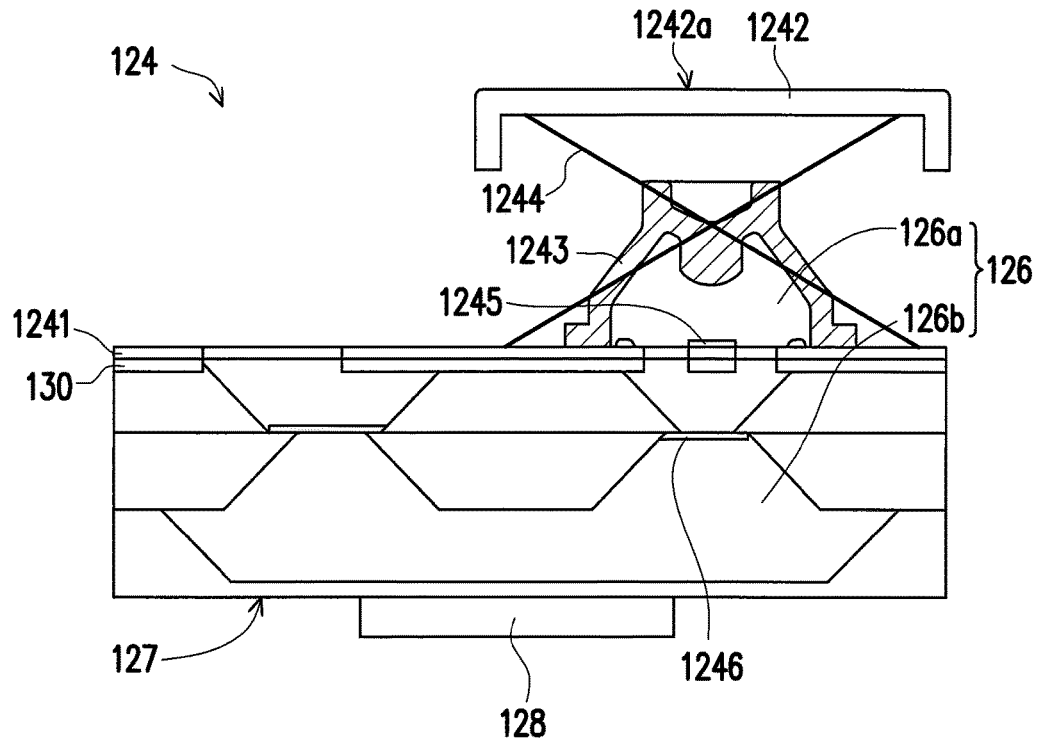
FIG. 2A is a schematic view illustrating an individual key, a micro pump chamber, and an actuator according to a first embodiment of a keyboard module of the electronic device shown in FIG. 1.

FIG. 1 is a schematic view of an electronic device, and FIG. 2A is a schematic view illustrating an individual key, a micro pump chamber, and an actuator according to a first embodiment of a keyboard module of the electronic device shown in FIG. 1. Referring to FIGS. 1 and 2A, an electronic device 100 of the embodiment includes a display 110 and a keyboard module 120. In addition, the keyboard module 120 is pivoted to the display 100, and the display 110 is adapted to flip with respect to the keyboard module 120, so that a keyboard surface 120a of the keyboard module 120 faces away from the display 110.

The keyboard module 120 includes a housing 122, a plurality of keys 124, a micro pump chamber 126, and an actuator 128. In addition, the housing 122 has a plurality of openings 122a, the keys 124 are disposed in the housing 122, and the keys 124 protrude from the openings 122a in a normal state. Each of the keys 124 includes a switch membrane 1241, a key cover 1242, an elastic element 1243, and a scissor unit 1244. The switch membrane 1241 has a key switch 1245. The key cover 1242 is disposed above the switch membrane 1241. The elastic element 1243 is disposed between the switch membrane 1241 and the key cover 1242, and the elastic element 1243 is adapted to be pressed and deformed by the key cover 1242 to trigger the key switch 1245. The scissor unit 1244 is disposed between the key cover 1242 and the switch membrane 1241 and adapted to support the key cover 1242. The micro pump chamber 126 disposed in the housing 122 and below the key cover 1242 includes a first chamber 126a, a second chamber 126b, and a check valve 1246. The second chamber 126b is disposed below the first chamber 126a. In addition, the second chamber 126b is adapted to communicate with the first chamber 126a. The check valve 1246 is disposed between the first chamber 126a and the second chamber 126b, so that gas in the first chamber 126a and the second chamber 126b flows unidirectionally from one of the first chamber 126a and the second chamber 126b to the other of the first chamber 126a and the second chamber 126b. The actuator 128 is connected to the micro pump chamber 126 and adapted to change a gas volume in the micro pump chamber 126 to drive the key 124 to be withdrawn into or protrude out of the opening 122a.

Specifically, the elastic element 1243 is a rubber dome, and the actuator 128 is a piezoelectric element. In addition, the piezoelectric element is disposed on a bottom wall 127 of the second chamber 126b. Besides, the elastic element 1243 has the first chamber 126a, and by squeezing of the actuator 128, the gas in the micro pump chamber 126 may be discharged through the check valve 1246 and the second chamber 126b from the first chamber 126a.

In a normal state of storage, the display 110 is closed relative to the keyboard module 120, and a display surface 110a of the display 110 faces toward the keyboard surface 120a of the keyboard module 120, and the keys 124 of the keyboard module 120 may protrude out of the openings 122a.

Figure 3A:
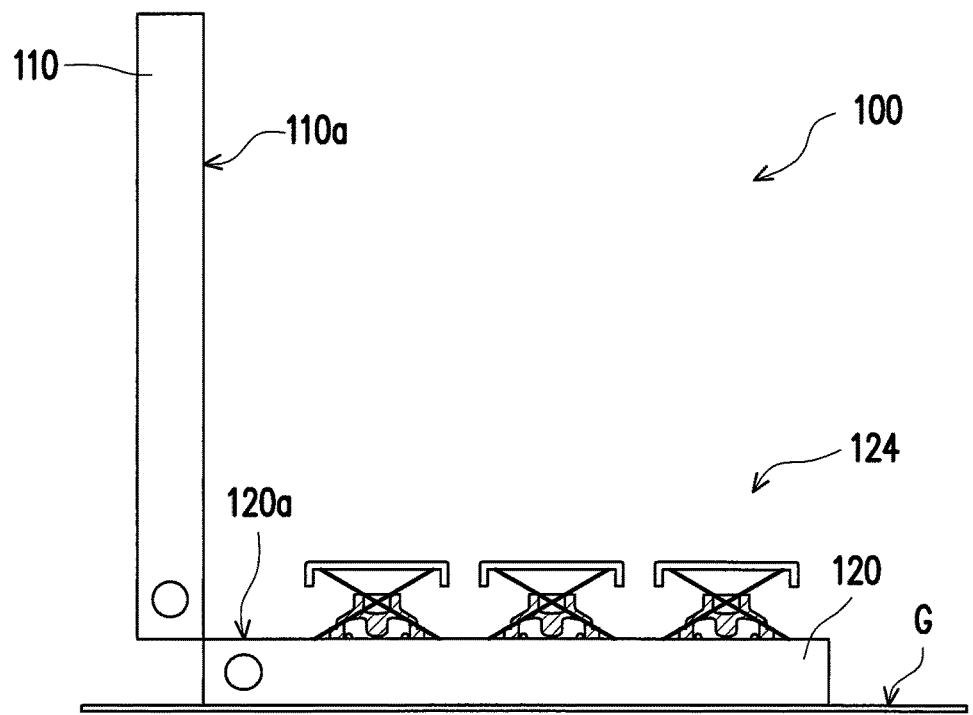
FIG. 3A is a schematic view illustrating an electronic device in a normal state of use.

In a normal state of use of the electronic device 100 (as shown in FIG. 3A), the display 110 is opened relative to the keyboard module 120. Under this circumstance, the display surface 110a of the display 110 still faces toward the keyboard surface 120a of the keyboard module 120, and the keys 124 of the keyboard module 120 still protrude out of the openings 122a. The user may exert a force on the key cover 1242 by pressing the key 124 to compress and deform the elastic element 1243. In the meantime, the pressed key cover 1242 may simultaneously deform the scissor unit 1242, and the elastic element 1243 is adapted to trigger the switch 1245 after being compressed and deformed.

Figure 3B:
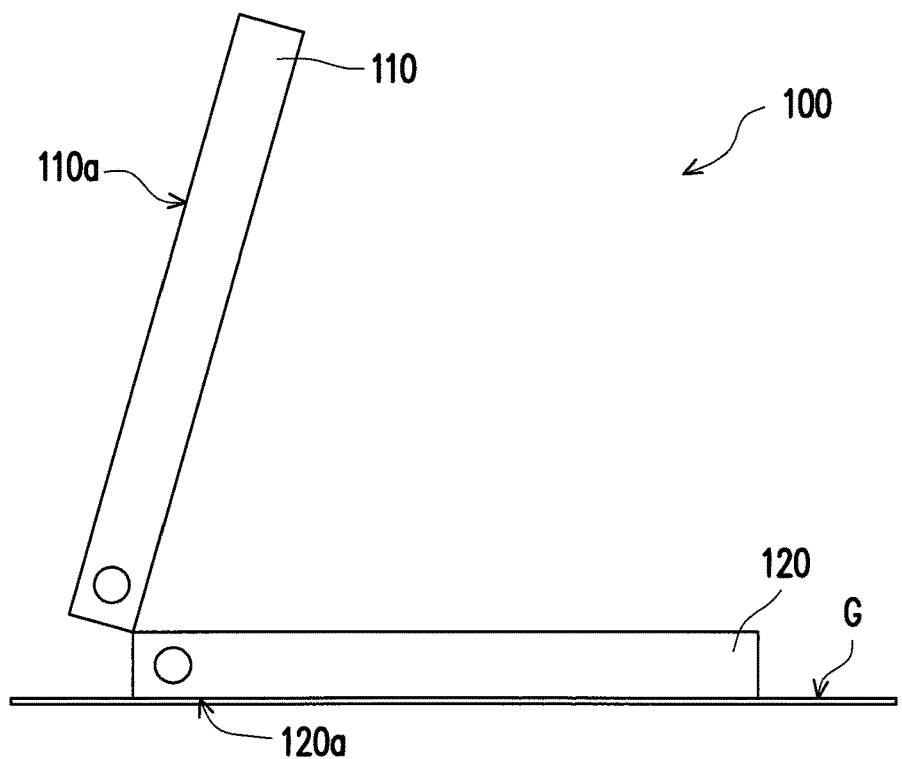
FIG. 3B is a schematic view illustrating that a keyboard surface of an electronic device is placed on a surface of placement.

Particularly, when the keys 124 of the keyboard module 120 are arranged to face away from the display 110, i.e., the display 110 is flipped over 180 degrees with respect to the keyboard module 120 to make the keyboard surface 120a of the keyboard module 120 face away from the display surface 110a (e.g., the user may flip the keyboard module 120 to the rear of the display 110 when the user needs to view the display 110 without having the keyboard module 120 located in front of the display 110 that may affect the viewability), the keyboard surface 120a of the keyboard module 120 is disposed toward a surface G (e.g., a desktop), as shown in FIG. 3B. In the situation, to prevent the weight of the electronic device 100 from being applied to the key cover 1242 to deform the elastic element 1243 and trigger the key switch 1245, the key 124 (as shown in FIG. 1) needs to be withdrawn in the opening 122a (as shown in FIG. 1).

In the embodiment, the key 124 is withdrawn into the opening 122a through interaction between the actuator 128 and the micro pump chamber 126.

Figure 2B:
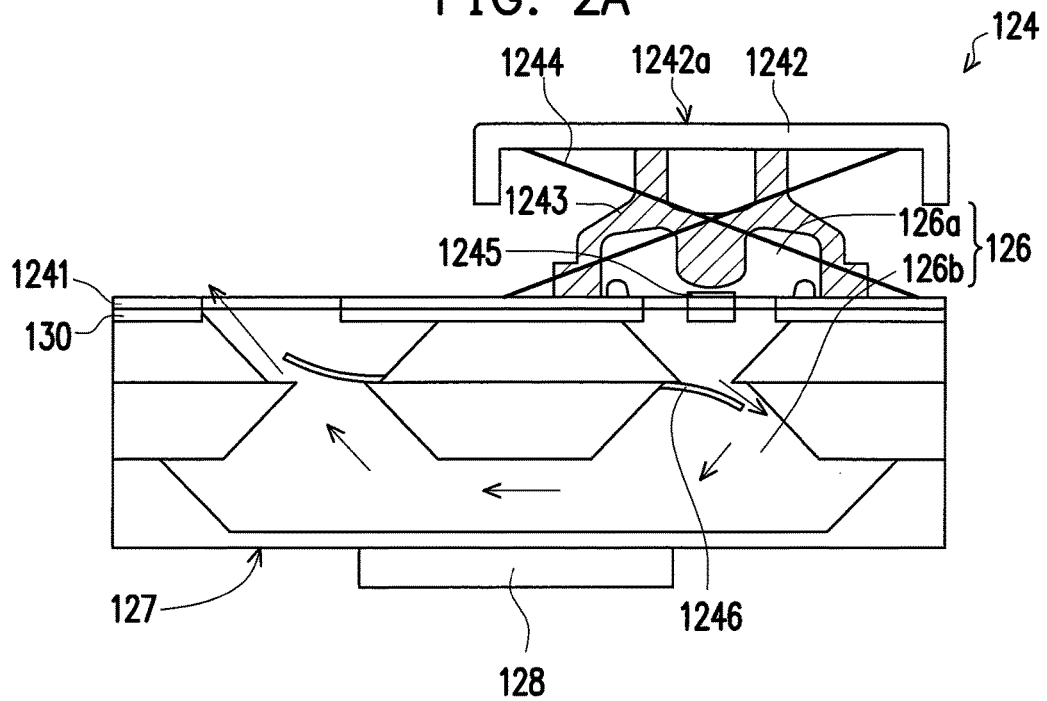
FIG. 2B is a schematic view illustrating that the actuator of FIG. 2A is in operation.

Referring to FIG. 2B, in the embodiment, a piezoelectric element is chosen as the actuator 128. The piezoelectric element is disposed on a lower surface (i.e., the bottom wall 127) of the micro pump chamber 126. In addition, by transmitting a signal to the piezoelectric element, the piezoelectric element is driven to continuously move vertically and squeeze the micro pump chamber 126, thereby, changing the gas volume (consequently changing a pressure) in the micro pump chamber 126 to withdraw the key 124 into the opening 122a. Specifically, the micro pump chamber 126 includes the first chamber 126a and the second chamber 126b. The elastic element 1243 has the first chamber 126a, the second chamber 126b is located below the first chamber 126a and communicates with the first chamber 126a. Also, the check valve 1246 disposed between the first chamber 126a and the second chamber 126b keeps the gas in the first chamber 126a flow unidirectionally into the second chamber 126b, whereas the gas in the second chamber 126b does not flow back to the first chamber 126a. Moreover, while the gas flowing unidirectionally from the first chamber 126a into the second chamber 126b is discharged out of the second chamber 126b through operation of the actuator 128, an external gas is unable to immediately pass through the check valve 1246 and enter the second chamber 126b or even the first chamber 126a. Thus, after the gas in the micro pump chamber 126 is discharged out of the micro pump chamber 126 through the operation of the actuator 128, gas volumes in the first chamber 126a and the second chamber 126b are reduced. Thus, a gas pressure is lower than an external atmospheric pressure, so the elastic element 1243 having the first chamber 126a may shrink, and the weight of the key cover 1242 is put on the scissor unit 1244 through shrinking of the elastic element 1245 to deform the scissor unit 1244 and move the key cover 1242 downward. Accordingly, the key 124 is withdrawn into the opening 122a of the housing 122. Here, the key 124 being withdrawn in the opening 122a of the housing 122 indicates that a top surface 1242a of the key cover 1242 may be aligned to or lower than a surface (i.e., the keyboard surface 120a) of the housing 122 and does not protrude out of the surface (i.e., the keyboard surface 120a) of the housing 122.

Since the electronic device 100 is arranged by placing the keyboard surface 120a of the keyboard module 120 to face toward the surface G, in order to maintain a state that the key 124 is withdrawn in the opening 122a, the electronic device 100 may further include a locking element 130 disposed between the first chamber 126a and the second chamber 126b. The locking element 130 may be electrically connected with and controlled by a central control unit (not shown) of the electronic device 100. Alternatively, the locking element 130 may also be mechanically controlled. In the embodiment, the locking element 130 is a separation plate adapted to prevent the first chamber 126a and the second chamber 126b from communicating with each other.

More specifically, the first chamber 126a and the second chamber 126b are isolated from each other by the locking element 130 mechanically or by electrical control, so as to keep the elastic element 1243 in a shrunk state and thus keep the key 124 withdrawn in the opening 122a.

After blocking between the first chamber 126a and the second chamber 126b by the locking element 130 is removed, the gas volume in the micro pump chamber 126 may gradually restore, and the elastic element 1243 may also gradually restore to its original form. Hence, the key 124 again protrudes out of the opening 122a.

Second Embodiment

Figure 4A:
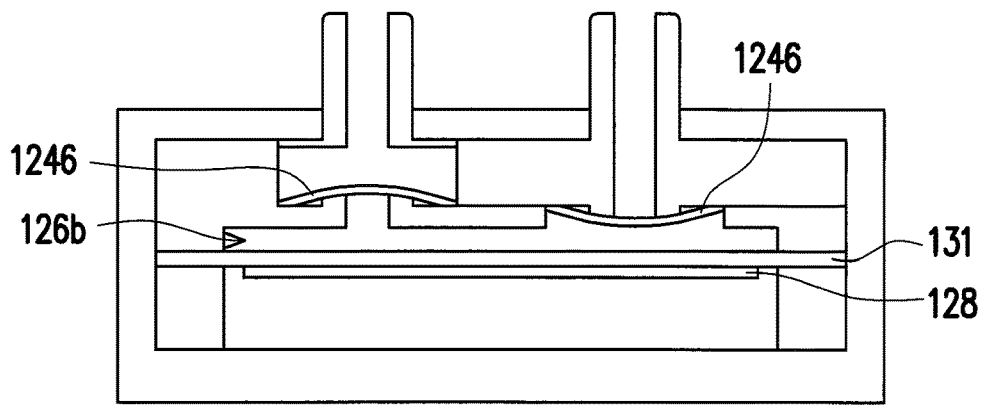
FIGS. 4A to 4C are schematic views illustrating a micro pump chamber and an actuator of a second embodiment.
Figure 4B:
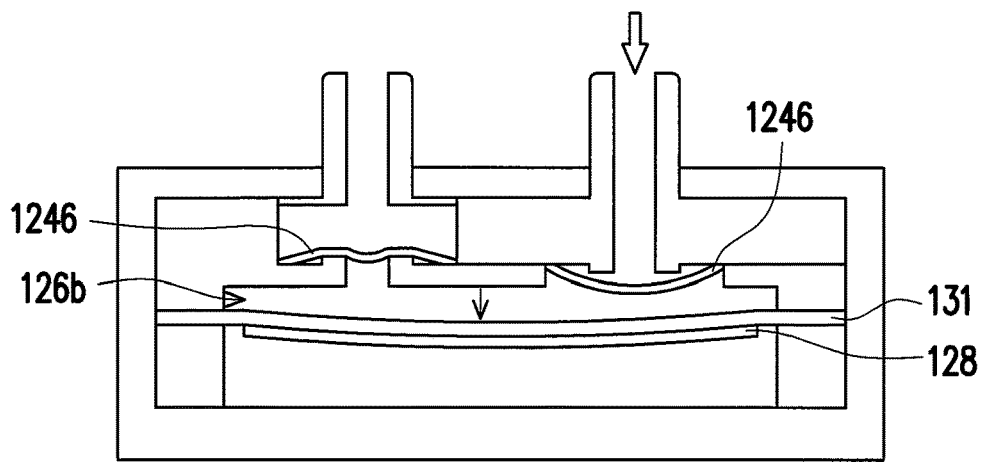
Figure 4C:
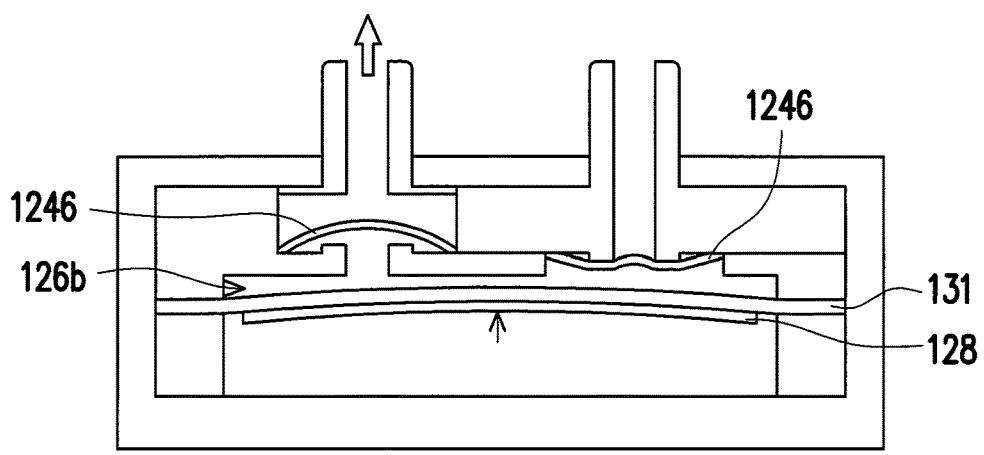

The second embodiment is similar to the first embodiment. Thus, like or similar reference numerals serve to represent like or similar components. FIGS. 4A to 4C are schematic views illustrating a key, a micro pump chamber and an actuator of the second embodiment. Referring to FIGS. 4A to 4C, the embodiment differs from the first embodiment in that the second chamber 126b is divided into an upper part and a lower part by a membrane 131, and the piezoelectric element serving as the actuator 128 is adhered to the membrane. As shown in FIGS. 4A to 4C, the piezoelectric element is adhered to a bottom of the membrane 131. However, in other embodiments, the piezoelectric element may also be adhered to a top of the membrane 131, and the configuration of the piezoelectric element and the membrane may be arranged based on the needs.

Third Embodiment

Figure 5:
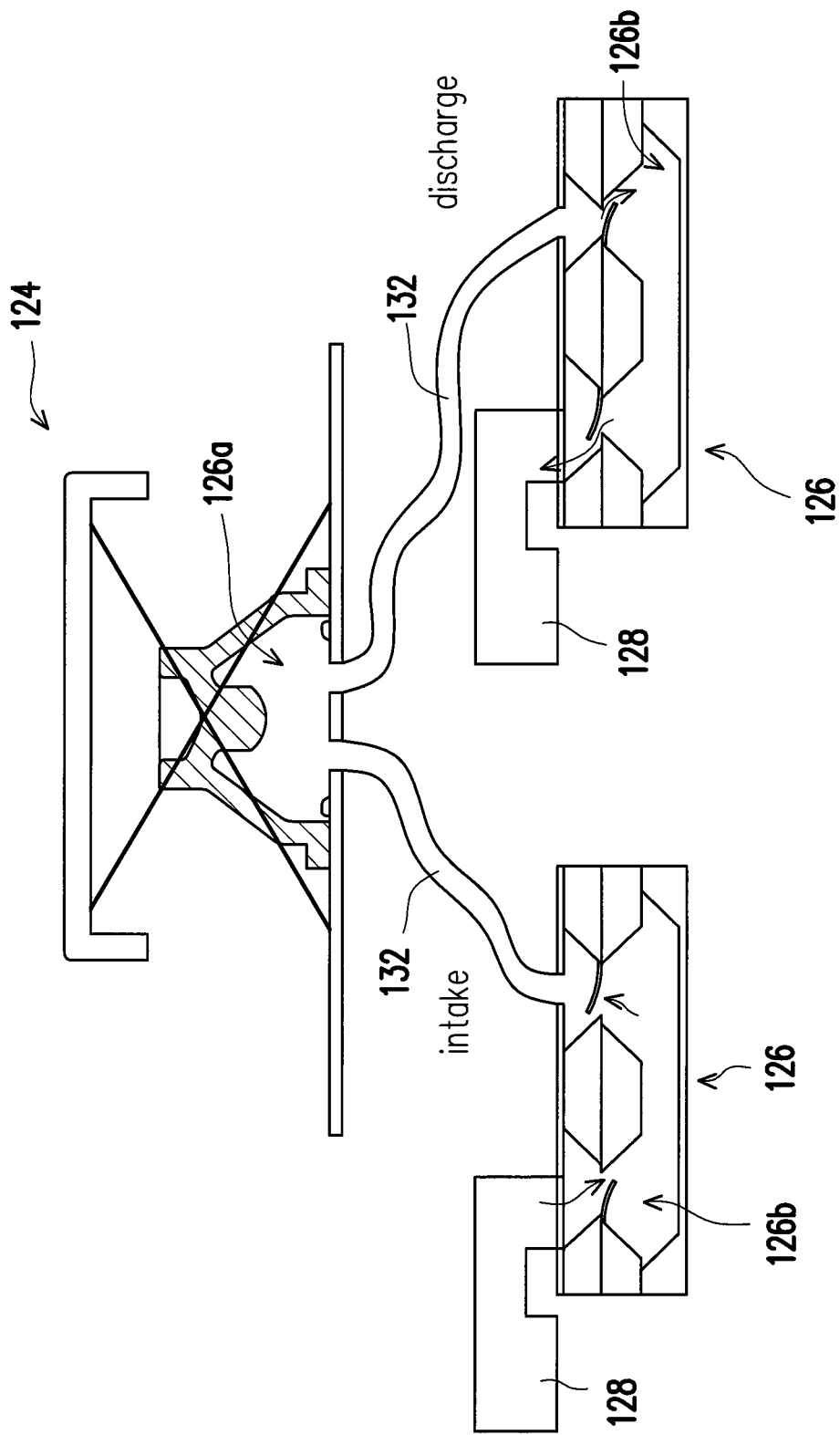
FIG. 5 is a schematic view illustrating a key, a micro pump chamber and an actuator of a third embodiment.

The third embodiment is similar to the previous embodiments. Thus, like or similar reference numerals serve to represent like or similar components. FIG. 5 is a schematic view illustrating a key, a micro pump chamber and an actuator of the third embodiment. Referring to FIG. 5, the embodiment differs from the previous embodiments in that the first chamber 126a of each of the keys 124 correspondingly communicates with the second chambers 126b of two micro pump chambers 126 through tubes 132. One of the two micro pump chambers 126 serves to discharge gas in the first chamber 126a, whereas the other micro pump chamber 126 serves to pump gas into the first chamber 126a.

Figure 6:
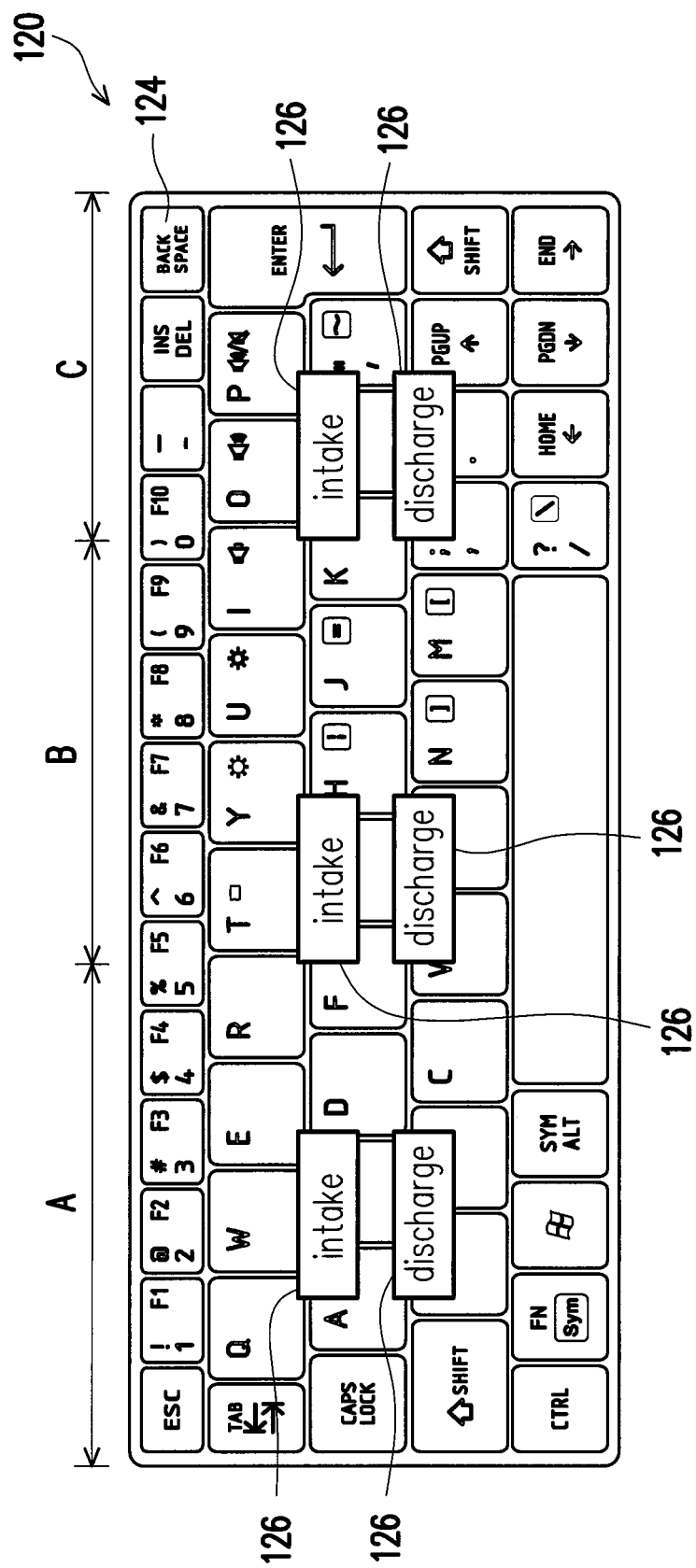
FIG. 6 is a schematic view illustrating that a keyboard device with three sets of micro pump chambers.

Besides, since one of the two micro pump chambers 126 serves to discharge gas from the first chamber 126a while the other of the micro pump chambers 126 serves to pump gas into the first chamber 126a, the two micro pump chambers 126 are paired and considered to be a set of micro pump chambers 126. In addition, as the keyboard module 120 may require three sets of the paired micro pump chambers 126, the keyboard device is divided into a plurality of regions A, B, and C based on the three sets of the paired micro pump chambers 126, as shown in FIG. 6.

Since the gas in the first chambers 126a of the keys 124 in the same region A, B, or C is discharged or pumped by the same micro pump chamber 126, using only a piezoelectric element as the actuator 128 requires a certain number of piezoelectric elements and may result in a higher cost and a complicated circuit design. Thus, in the embodiment, the actuator 128 may include a discharge pump and an intake pump. The discharge pump communicates with the micro pump chamber 126 that discharges the gas of the first chamber 126a, whereas the intake pump communicates with the micro pump chamber 126 that pumps the gas into the first chamber 126a.

Fourth Embodiment

Figure 7:
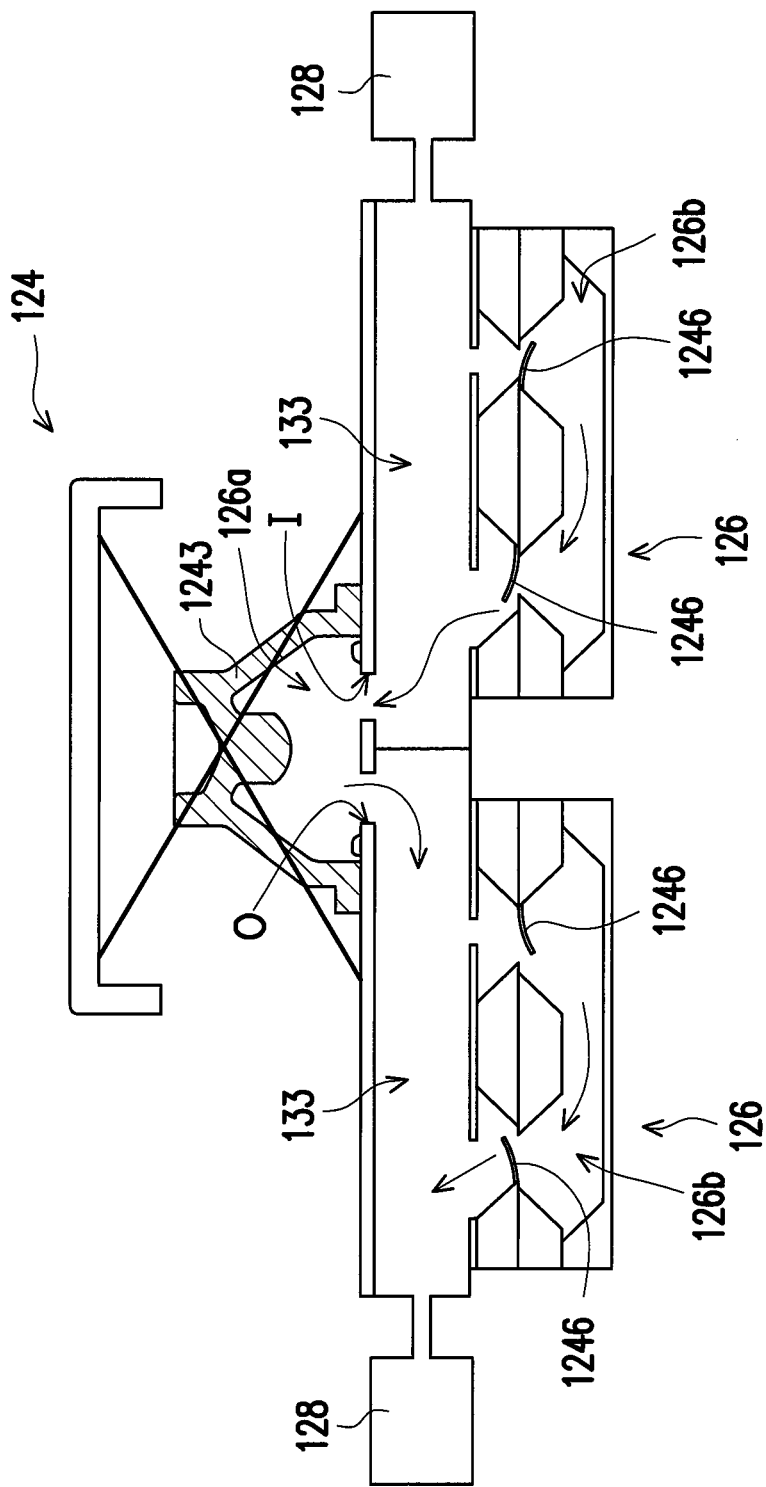
FIG. 7 is a schematic view illustrating a key, a micro pump chamber and an actuator of a fourth embodiment.

The fourth embodiment is similar to the third embodiment. Thus, like or similar reference numerals serve to represent like or similar components. FIG. 7 is a schematic view illustrating the key 124, the micro pump chamber 126 and the actuator 128 of the fourth embodiment. Referring to FIG. 7, the embodiment differs from the previous embodiments in that the tube connecting the first chamber 126a and the second chamber 126b is replaced with an integrated flow channel 133. The flow channel 133 may be disposed corresponding to one set of the micro pump chambers 126. Therefore, corresponding to the regions A, B, and C (shown in FIG. 6) of the keyboard module 120, three flow channels 133 are disposed in the embodiment, and the three flow channels may be assembled with each other and thus integrated. The flow channel 133 is disposed between the first chamber 126a and the second chamber 126b. In addition, the flow channel 133 may communicate with the first chamber 126a, while the second chamber 126b may be isolated from the flow channel 133 by the check valve 1246.

Specifically, each of the first chambers 126a is correspondingly in communication with an inlet I and an outlet O of the flow channel 133. In addition, the flow channel 133 may be divided into an intake region (not shown) and a discharge region (not shown). The inlet I is located in the intake region, the outlet O is located in the discharge region, and the intake region and the discharge region of the flow channel do not communicate with each other.

Therefore, when the intake pump operates, the discharge pump does not operate, and the gas of the first chamber 126a is discharged through the discharge region of the flow channel 133 and the second chamber 126b, so that the elastic element 1243 may shrink, and the key 124 may thus be withdrawn into the opening 122a (as shown in FIG. 1). To enable the key 124 to protrude out of the opening 122a, it only requires the intake pump to operate and the discharge pump not to operate, so as to pump gas into the first chamber 126a to have the elastic element 1243 restore to the original form. Accordingly, the key 124 may protrude out of the opening 122a again.

In view of the foregoing, the keyboard module according to the embodiments of the invention allows the keys to be withdrawn into the openings of the housing through the communication between the micro pump chambers and the keys and the operation of the actuators. Accordingly, the usability of the keyboard module is diversified. For example, the keyboard module may be disposed in an electronic device such as a laptop computer, or the keyboard module may be assembled with a tablet computer. In this way, the keyboard surface of the tablet computer or the laptop computer may be placed on a surface after the keys are withdrawn into the openings of the housing, so as to prevent the keys from being triggered due to the weight of the electronic device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A keyboard module, comprising:
   a housing, having a plurality of openings;
   a plurality of keys, disposed in the housing and adapted to protrude out of the openings, wherein each of the keys comprises:
   a switch membrane, having a key switch;
   a key cover, disposed above the switch membrane;
   an elastic element, disposed between the switch membrane and the key cover, and adapted to be pressed and deformed by the key cover to trigger the key switch; and
   a scissor unit, disposed between the key cover and the switch membrane for supporting the key cover;
   a micro pump chamber, disposed in the housing and located below the key cover, wherein the micro pump chamber comprises:
   a first chamber;
   a second chamber, disposed below the first chamber and communicating with the first chamber; and
   a check valve, disposed between the first chamber and the second chamber, wherein gas in one of the first chamber and the second chamber flows unidirectionally into the other of the first chamber and the second chamber; and
   an actuator, connected to the micro pump chamber and adapted to change a gas volume in the micro pump chamber for driving the keys to be withdrawn into or protrude out of the openings.

2. The keyboard module as claimed in claim 1, wherein the elastic element is a rubber dome.

3. The keyboard module as claimed in claim 1, wherein the actuator is a piezoelectric element.

4. The keyboard module as claimed in claim 3, wherein the piezoelectric element is disposed on a bottom wall of the second chamber.

5. The keyboard module as claimed in claim 3, wherein the second chamber is divided into an upper part and a lower part by a membrane, and the piezoelectric element is adhered to the membrane.

6. The keyboard module as claimed in claim 1, wherein the actuator is a discharge pump or an intake pump.

7. The keyboard module as claimed in claim 1, wherein the elastic element comprises the first chamber.

8. The keyboard module as claimed in claim 1, further comprising a flow channel disposed between the first chamber and the second chamber, wherein the flow channel communicates with the first chamber, and the second chamber is isolated from the flow channel by the check valve.

9. The keyboard module as claimed in claim 8, wherein each of the first chambers is correspondingly in communication with to an inlet and an outlet of the flow channel.

10. The keyboard module as claimed in claim 1, further comprising a plurality of ventilation tubes disposed between the first chamber and the second chamber.

11. An electronic device, comprising:
    a display;
    a keyboard module, pivoted to the display adapted to flip with respect to the keyboard module, wherein the keyboard module comprises:
    a housing, having a plurality of openings;
    a plurality of keys, disposed in the housing and adapted to protrude out of the openings, wherein each of the keys comprises:
    a switch membrane, having a key switch;
    a key cover, disposed above the switch membrane;
    an elastic element, disposed between the switch membrane and the key cover, and adapted to be pressed and deformed by the key cover to trigger the key switch; and
    a scissor unit, disposed between the key cover and the switch membrane for supporting the key cover;
    a micro pump chamber, disposed in the housing and located below the key cover, wherein the micro pump chamber comprises:
    a first chamber;
    a second chamber, disposed below the first chamber and communicating with the first chamber; and
    a check valve, disposed between the first chamber and the second chamber, wherein gas in one of the first chamber and the second chamber unidirectionally enters the other of the first chamber and the second chamber; and
    an actuator, connected to the micro pump chamber and adapted to change a gas volume in the micro pump chamber for driving the keys to be withdrawn into or protrude out of the openings.

12. The electronic device as claimed in claim 11, wherein when the keys of the keyboard module face away from the display, the keys are withdrawn in the openings.

13. The electronic device as claimed in claim 12, further comprising a locking element disposed between the first chamber and the second chamber and electrically connected with a central control unit of the electronic device, wherein the locking element is controlled by the central control unit to keep the key withdrawn in the opening.

14. The electronic device as claimed in claim 13, wherein the locking element is a separation plate adapted to prevent the first chamber and the second chamber from communicating with each other.

* * * * *